US006919279B1

(12) United States Patent
Rulkens et al.

(10) Patent No.: US 6,919,279 B1
(45) Date of Patent: Jul. 19, 2005

(54) ENDPOINT DETECTION FOR HIGH DENSITY PLASMA (HDP) PROCESSES

(75) Inventors: Ron Rulkens, Milpitas, CA (US); Didier Florin, Lewisville, TX (US)

(73) Assignee: Novellus Systems, Inc., San Jose, CA (US)

( * ) Notice: Subject to any disclaimer, the term of this patent is extended or adjusted under 35 U.S.C. 154(b) by 150 days.

(21) Appl. No.: 10/267,413

(22) Filed: Oct. 8, 2002

(51) Int. Cl.$^7$ .......................................... H01L 21/302
(52) U.S. Cl. ................... 438/706; 438/710; 438/711; 438/714; 438/719
(58) Field of Search ............................. 438/706, 710, 438/711, 714, 719

(56) References Cited

U.S. PATENT DOCUMENTS

| | | | |
|---|---|---|---|
| 4,615,761 A | 10/1986 | Tada et al. .................. 156/626 |
| 4,839,311 A | * 6/1989 | Riley et al. .................... 438/14 |
| 4,953,982 A | 9/1990 | Ebbing et al. ............... 356/357 |
| 5,045,149 A | 9/1991 | Nulty .......................... 156/627 |
| 5,288,367 A | 2/1994 | Angell et al. ................ 156/626 |
| 5,322,590 A | 6/1994 | Koshimizu .................. 156/626 |
| 5,450,205 A | 9/1995 | Sawin et al. ................ 356/382 |
| 5,504,328 A | 4/1996 | Bonser ........................ 250/288 |
| 5,552,016 A | * 9/1996 | Ghanayem ............. 156/345.25 |
| 5,653,894 A | 8/1997 | Ibbotson et al. .............. 216/59 |
| 5,658,423 A | 8/1997 | Angell et al. .................. 438/9 |
| 5,712,702 A | 1/1998 | McGahay et al. .......... 356/311 |
| 5,728,253 A | 3/1998 | Saito et al. .................. 156/345 |
| 5,737,496 A | 4/1998 | Frye et al. ..................... 395/23 |
| 5,759,424 A | 6/1998 | Imatake et al. ............... 216/60 |
| 5,788,869 A | 8/1998 | Dalton et al. ................. 216/60 |
| 5,807,761 A | 9/1998 | Coronel et al. ............... 438/14 |
| 5,846,373 A | 12/1998 | Pirkle et al. ................. 156/345 |
| 5,864,773 A | 1/1999 | Barna et al. .................. 702/85 |
| 5,877,032 A | 3/1999 | Guinn et al. ................... 438/9 |
| 5,910,011 A | 6/1999 | Cruse .......................... 438/16 |
| 5,963,336 A | 10/1999 | McAndrew et al. ........ 356/437 |
| 5,966,586 A | 10/1999 | Hao .............................. 438/7 |
| 5,980,767 A | 11/1999 | Koshimizu et al. ........... 216/60 |
| 5,986,747 A | 11/1999 | Moran ......................... 356/72 |
| 5,989,928 A | 11/1999 | Nakata et al. .................. 438/7 |
| 6,017,414 A | 1/2000 | Koemtzopoulos et al. .. 156/345 |
| 6,046,796 A | 4/2000 | Markle et al. ................ 356/72 |
| 6,054,333 A | 4/2000 | Bensaoula .................... 438/9 |
| 6,068,783 A | 5/2000 | Szetsen ........................ 216/60 |
| 6,071,375 A | 6/2000 | Chen et al. .................. 156/345 |
| 6,074,516 A | 6/2000 | Howald et al. ............. 156/345 |
| 6,077,386 A | 6/2000 | Smith, Jr. et al. ........... 156/345 |
| 6,077,387 A | 6/2000 | Tesauro ...................... 156/345 |
| 6,081,334 A | 6/2000 | Grimbergen et al. ....... 356/357 |
| 6,090,302 A | 7/2000 | Smith, Jr. et al. ............. 216/60 |
| 6,123,983 A | 9/2000 | Smith, Jr. et al. ............. 427/10 |
| 6,124,927 A | 9/2000 | Zhong et al. ................ 356/311 |
| 6,132,577 A | 10/2000 | Smith, Jr. et al. ....... 204/298.32 |
| 6,134,005 A | 10/2000 | Smith, Jr. et al. ........... 356/346 |
| 6,146,492 A | 11/2000 | Cho et al. .................. 156/345 |
| 6,153,115 A | 11/2000 | Le et al. ....................... 216/60 |
| 6,154,284 A | 11/2000 | McAndrew et al. ........ 356/437 |
| 6,157,447 A | 12/2000 | Smith, Jr. et al. ........... 356/316 |

(Continued)

Primary Examiner—Duy-Vu Deo
Assistant Examiner—Binh X. Tran
(74) Attorney, Agent, or Firm—MacPherson Kwok Chen & Heid LLP; Tom Chen

(57) ABSTRACT

A method and system are provided for endpoint detection of plasma chamber cleaning or plasma etch processes. Optical emission spectroscopy is utilized to determine a spectral emission ratio of two or more light emitting reaction components at wavelengths in close proximity. When a spectral emission ratio or derivative thereof or mathematical function thereof falls below a selected threshold value, the plasma process may be terminated within a calculated time from the threshold value prior to an endpoint value cutoff. Advantageously, the system and methods of the present invention provide real-time, in-situ monitoring of plasma clean or etch processes to optimize the process and avoid under-cleaning or over-cleaning.

27 Claims, 4 Drawing Sheets

U.S. PATENT DOCUMENTS

| | | | |
|---|---|---|---|
| 6,159,297 A | 12/2000 | Herchen et al. | 118/708 |
| 6,164,295 A | 12/2000 | Ui et al. | 134/1.1 |
| 6,165,312 A | 12/2000 | Smith, Jr. et al. | 156/345 |
| 6,169,933 B1 | 1/2001 | Smith, Jr. et al. | 700/121 |
| 6,192,826 B1 | 2/2001 | Smith, Jr. et al. | 118/723 |
| 6,200,412 B1 | 3/2001 | Kilgore et al. | 156/345 |
| 6,221,679 B1 | 4/2001 | Smith, Jr. et al. | 438/7 |
| 6,223,755 B1 | 5/2001 | Smith, Jr. et al. | 134/1.1 |
| 6,238,937 B1 | 5/2001 | Toprac et al. | 438/9 |
| 6,246,473 B1 | 6/2001 | Smith, Jr. et al. | 356/316 |
| 6,254,717 B1 | 7/2001 | Smith, Jr. et al. | 156/345 |
| 6,261,470 B1 | 7/2001 | Smith, Jr. et al. | 216/60 |
| 6,264,852 B1 | 7/2001 | Herchen et al. | 216/60 |
| 6,269,278 B1 | 7/2001 | Smith, Jr. et al. | 700/121 |
| 6,275,740 B1 | 8/2001 | Smith, Jr. et al. | 700/108 |
| 6,297,064 B1 * | 10/2001 | Koshimizu | 438/9 |
| 6,303,044 B1 | 10/2001 | Koemtzopoulos et al. | 216/59 |
| 6,306,246 B1 | 10/2001 | Melvin et al. | 156/345 |
| 6,344,151 B1 | 2/2002 | Chen et al. | 216/60 |
| 6,350,697 B1 | 2/2002 | Richardson et al. | 438/710 |
| 6,355,570 B1 | 3/2002 | Nakata et al. | 438/706 |
| 6,537,460 B1 * | 3/2003 | Shiobara | 216/60 |
| 6,791,692 B2 * | 9/2004 | Powell et al. | 356/496 |

* cited by examiner

ENDPOINT DETECTION FOR HIGH DENSITY PLASMA (HDP) PROCESSES

BACKGROUND

1. Field of Invention

The present invention generally relates to semiconductor processing and, more particularly, to a method and system for endpoint detection of plasma chamber cleaning processes and/or etch processes.

2. Related Art

Plasma etching and deposition is now a common process in semiconductor manufacturing to form active areas, lines, holes, and other device features. During plasma etching and/or deposition, process gases are introduced into a plasma chamber where they are excited by power sources to form a plasma. The plasma species react with exposed substrate areas and form volatile species which depart from the substrate, thereby forming desired features of a semiconductor device. The plasma then becomes a complex mixture of native reactant gases and etched products, including molecules, ions, neutral radicals, and other species.

Plasma processing of wafers within a plasma chamber has an effect on the interior of the processing chamber. Reaction by-products can deposit on the inside surface of the chamber walls and cause serious problems as they accumulate. For example, in addition to affecting the chamber processing conditions, thereby degrading the processing stability, the accumulated by-products on the chamber walls may dislodge and settle on the surface of the substrate causing defects that are likely to negatively affect the entire chip. Therefore, the removal of the accumulated by-products becomes extremely important.

Processing chambers are typically removed from the production line on a scheduled, periodic basis for a cleaning operation to address the above-noted conditions. Cleaning operations can include plasma cleans of the interior of the chamber, wet cleans of the interior of the chamber, and replacement of certain components of the processing chamber which may actually be consumed by the plasma processes conducted therein.

In-situ plasma cleaning is desirable due to its efficiency. During plasma cleaning, cleaning gases are introduced into the chamber to react with the by-products accumulated on the chamber walls and to reduce the thickness thereof by chemical action, mechanical action, or both. Resulting vapors and particulate matter are exhausted from the chamber to realize a "cleaning" of the chamber. With this technique, it is not necessary to open the chamber for cleaning; thus no time-consuming machine-setup is required after cleaning.

Monitoring of such plasma cleaning processes may be accomplished through optical emission spectroscopy (OES), a technique by which light emitted by a process, such as a plasma etch within a chamber, is analyzed to see which wavelengths are present in the light. Inferences about the process may then be drawn as a result of the intensity of the various spectral lines present in the light. For example, the presence of certain species within the chamber may be ascertained because each kind of molecule or atom has a characteristic optical emission at specific wavelengths (optical emission spectrum). When the cleaning plasma reacts with the accumulated by-products, related product species are formed and may be identified by their unique and characteristic optical emission. After the accumulated by-products have been removed from the chamber and the chamber walls are exposed to the plasma, there is a change in the optical emission. This change in optical emission can be used to detect the endpoint of the cleaning process.

Optical emission spectra may be detected using a light or optical sensor. Due to the extreme environmental conditions within a chamber, the sensor device is usually placed outside the chamber. This configuration requires that the chamber have an emission detection window for the plasma light emissions to pass through before detection by a light emission spectrometer or other sensor device.

A major problem with OES monitoring encountered during a plasma clean or etch process is inconsistent or misleading emission signals due to several reasons. One cause may be the build up of contaminants on the surface of the detection window itself. This is due to a reaction product which is deposited on the surface of the window, or an unevenness which is created thereon by the impact of the ions from the plasma. As a result, when a plasma light emission passes through the window, a waveform component inherent to the material forming the deposit is absorbed or it is randomly reflected on the inner surface of the window so that the light intensity is decreased. This problem results in false readings of the state of the etch process and inefficient cleaning. Further, contaminants on the window may be getting etched by the plasma to give inconsistent readings. The plasma itself is also not in a constant state because of fluctuating power, flow rates, or other causes.

Currently, a time-mode technique is typically used for detecting the endpoint of a plasma clean. The cleaning process is performed for a fixed period of time estimated to remove the by-products accumulated on the chamber walls. Thus, it is obvious that either under-cleaning or over-cleaning is likely to occur. Under-cleaning may lead to particle problems and degradation of processing stability. Over-cleaning results in the highly reactive cleaning gases attacking the chamber wall and shortening its lifetime. Further, expensive cleaning gases may be wasted and cleaning time is not optimized.

Therefore, what is needed is a monitoring method and system which can provide an accurate indication of the endpoint of a plasma chamber cleaning process or plasma etch process without being affected by a change in plasma light transmission caused by contaminants on a detection window or changing plasma state in order to optimize the cleaning or etch process and prevent over-cleaning/etching or under-cleaning/etching.

SUMMARY

The present invention provides a method and system for detecting the endpoint of a plasma etch process by monitoring spectral emissions of two reaction components at wavelengths in close proximity.

In one embodiment of the present invention, a method of monitoring a plasma process comprises providing a spectral emission of a first reaction component at a selected wavelength and providing a spectral emission of a second reaction component at a wavelength in close proximity to the selected wavelength of the first reaction component, wherein the close proximity is between about 1 nm and about 50 nm. A ratio including the first reaction component spectral emission and the second reaction component spectral emission is determined, and the ratio is monitored as a function of time to determine an endpoint of the plasma process.

In another embodiment, a method of monitoring a plasma process comprises determining a ratio including the first reaction component spectral emission and the second reaction component spectral emission, determining a derivative value of the ratio, monitoring the derivative value of the ratio as a function of time, and ending the plasma process before the derivative value reaches a value of about zero.

In yet another embodiment of the present invention, a system for detecting an endpoint of a plasma process comprises a plasma chamber having chamber walls and a transmission window, and a light measurement apparatus in optical communication with the transmission window, whereby the light measurement apparatus is sensitive to measuring optical emissions with a wavelength between about 200 nm and about 1,100 nm generated by a plasma within the plasma chamber. A controller is also operably coupled to the plasma chamber and the light measurement apparatus, wherein the controller monitors a ratio of a first reaction component spectral emission and a second reaction component spectral emission at wavelengths in close proximity to one another between about 1 nm and about 50 nm.

Advantageously, the present invention allows for optimal plasma etching or cleaning of a plasma chamber by providing a real-time, in-situ endpoint detection method and system which avoids over-cleaning/etching and under-cleaning/etching. Accumulated by-products are cleaned from a plasma chamber without wasting cleaning time or expensive plasma cleaning gas while also avoiding chamber wall corrosion.

This invention will be more fully understood in light of the following detailed description taken together with the accompanying drawings.

BRIEF DESCRIPTION OF DRAWINGS

Use of the same reference symbols in different figures indicates similar or identical items.

DETAILED DESCRIPTION

Figure 1:
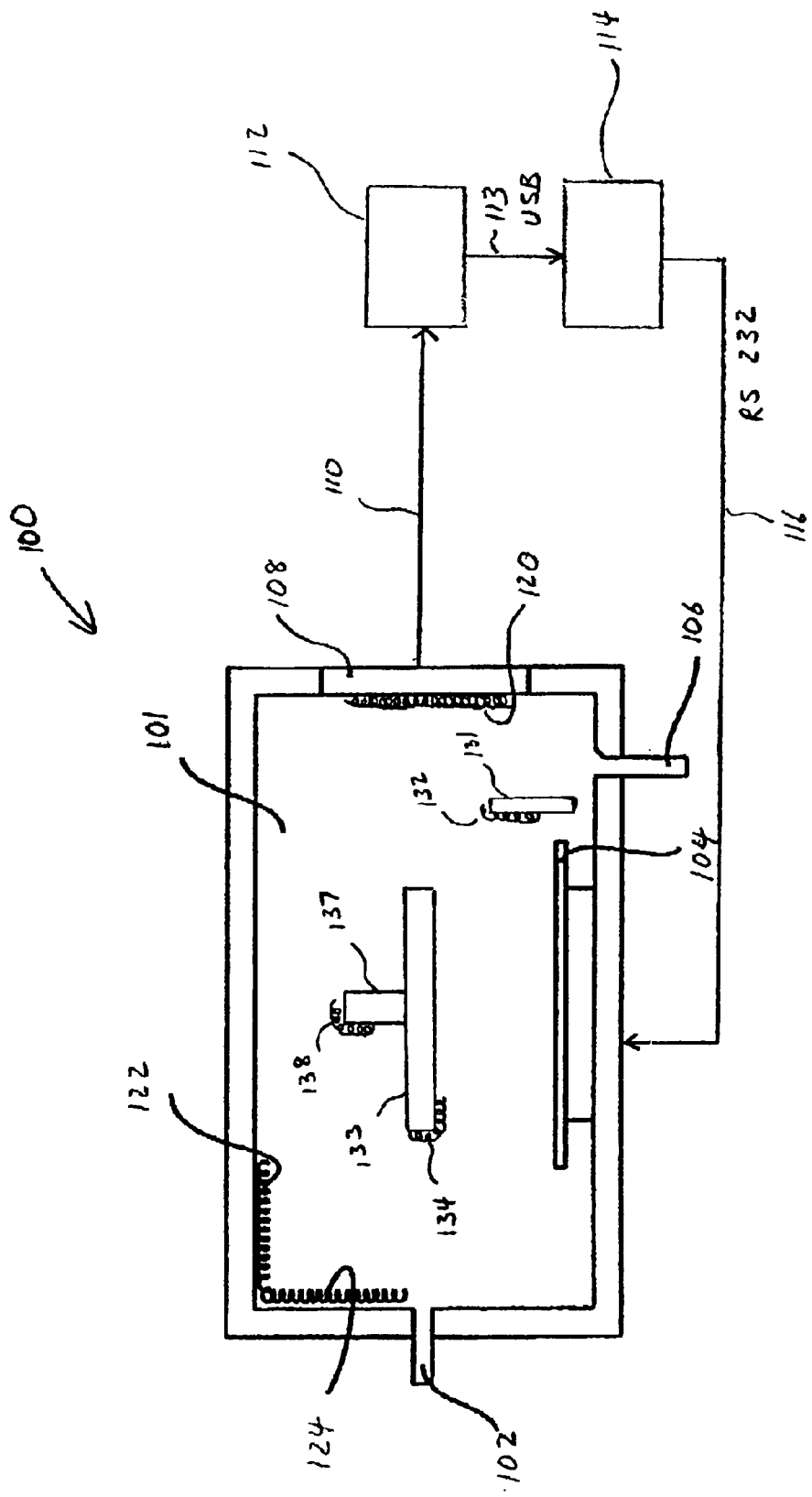
FIG. 1 shows a schematic of a plasma clean monitoring system including a plasma chamber, a light measurement apparatus, and a controller, in accordance with one embodiment of the present invention.

FIG. 1 illustrates a system 100 for monitoring and detecting the endpoint of a plasma clean or etch process in accordance with one embodiment of the present invention. A cross section of one example of a plasma chamber 101 is shown, including a plasma source gas outlet 102, a gas inlet 106, a wafer holder 104, an observation port 108, and a electrode/shower head 133.

Observation port 108 is provided in the main body of plasma chamber 101 and may be made of corrosion resistant material that allows light to pass through, such as quartz glass or sapphire. Observation port 108 may include a window and/or a light pipe in one example. Accordingly, optical emissions that are radiated from the inside of chamber 101 can be detected and measured through observation port 108.

One example of a plasma chamber 101, with no intent to limit the invention thereby, is a SPEED™ plasma chamber, available from Novellus Systems, Inc. of San Jose, Calif. Electrode/shower head 133 is powered by electrode feed 137 (RF excitation and/or DC bias in one example). Structure 131 represents optional mechanical parts for the chamber, such as a heat shield, lateral electrode, wafer centering structure, and a heater.

In one embodiment, a light measurement apparatus 112 outside of chamber 101 is in optical communication with observation port 108 and is capable of receiving optical emissions through transport 110. In one example, optical emissions may be received through a fiber optic cable operably coupled to observation port 108. Light measurement apparatus 112 can be used to select or filter certain frequencies from the optical emissions that are to be measured from chamber 101 and can measure the intensity of the optical emissions. One example of light measurement apparatus 112, with no intent to limit the invention thereby, is an optical emission spectrograph, model SD204BLC, available from Verity Instruments, Inc. of Carrollton, Tex.

In another example of a light detection system that may be used, plasma light is collected via a UV transparent optical fiber and brought into a spectrometer, where the light diffracts off a diffraction grating and is dispersed into its components. The dispersed light falls onto a linear photodetector array which measures the light intensity. The result of this is a measurement of light intensity as a function of wavelength (each position on the linear array corresponding to a different wavelength) which is sampled simultaneously.

Other methods that may be used to analyze the spectral content of the emitted light include the use of a single optical detector (e.g., a photomultiplier tube) which is scanned over a range of frequencies (i.e., a "scanning monochrometer"), and the use of a single detector in combination with an optical bandpass filter.

A controller 114 may then be used in a closed loop in conjunction with light measurement apparatus 112 and chamber 101 to determine whether the cleaning process should be terminated based upon signals from light measurement apparatus 112 and parameters entered into controller 114. In one example, a universal serial bus (USB) interface 113 may be used for communications between light measurement apparatus 112 and controller 114. In a further example, a RS 232 interface 116 may be used for communications between controller 114 and plasma chamber 101.

Controller 114 is used to determine when the cleaning process should be terminated and may include a computer with software and a user interface for data analysis and parameter entry. Parameter information which may be entered includes the time when a clean step starts, choice of algorithm, choice of emissions, averaging factors, and amount of overetch. Controller 114 may also have the capability to signal a warning or error message if no process endpoint is detected within a selected time range. Furthermore, controller 114 may have the capability to automatically perform periodic self-diagnostic tests of endpoint detection system 100 and signal a warning or error message if any self-diagnostic test fails. Such self-diagnostic tests may include, for example, whether communications between controller 114 and chamber 101 are functioning properly, whether the optical fiber is functioning properly upon detection of light above a certain intensity threshold, and whether the light measurement apparatus is still within required calibration specifications. Controller 114 may transmit a signal to chamber 101 so as to terminate the plasma process when a process endpoint is reached. The cleaning or etch process may be terminated in various ways, including termination of cleaning gases and/or termination of power to the chamber that is used to form the plasma. It is noted that controller 114 may be an integral part of light measurement apparatus 112 or a separate apparatus.

As previously discussed, by-products from the deposition or etching of a silicon-based film accumulate on the chamber walls and need to be cleaned before the by-products begin to flake off and create particle problems or otherwise degrade processing performance. Accumulation of wafer processing by-products inside chamber 101 is highlighted in FIG. 1 by accumulation 120 on or near observation port 108, by accumulation 122 on the ceiling of plasma chamber 101, by accumulation 124 near gas outlet 102, by accumulation 134 on electrode/shower head 133, by accumulation 138 on electrode feed 137, and by accumulation 132 on structure 131.

Fluorine-containing plasma is preferably used to clean the plasma chamber of accumulated by-products when the chamber interior is made of material resistant to fluorine, for example, alumina ceramic. In general, fluorinated molecules, such as $CF_4$, $C_2F_6$, $C_4F_8$, $C_3F_8$, $SF_6$, $NF_3$, $F_2$, and $OF_2$, can be used as the plasma source gas. Chloride ($Cl_2$) and bromide ($Br_2$) may also be used as active clean gases. Inert gases such as argon (Ar) and helium (He) may be included in the plasma source gas mixture to reduce corrosion of the chamber walls.

After wafer holder 104 is covered by an etch cover, such as an alumina ceramic wafer, to protect wafer holder 104 during the cleaning process, source gas is introduced into chamber 101 through gas inlet 106. Power is then supplied to electrodes (not shown) or similar chamber devices to excite the source gas and form plasma. The plasma will react with and etch the accumulated by-products, resulting in many reaction components, including reaction reactant and reaction product molecules, ions, radicals, and other species.

The following equations present a general representation of the reactions involved in a plasma chamber clean.

$$PR \rightarrow S1 + R \qquad (1)$$

$$FM + R + A + I + S1 \rightarrow PG + S + S2 + S3 + S4 + I \qquad (2)$$

where
PR is precursor clean gas (e.g., $NF_3$, HF, $SF_6$, $C_wH_xO_yF_z$, $F_2$, $Cl_2$, or $Br_2$),
S1 is side-product 1 (e.g., N or $N_2$ for $NF_3$),
R is reactive clean gas (e.g., F, Cl, or Br)
FM is film to be cleaned or etched (e.g., $SiO_2$, SiC, Si, SiN, C, or other films),
A is aid gas (e.g., $O_2$),
I is inert gas (e.g, He, Ne, Ar, Xe, or Kr),
PG is product gas (e.g., $SiF_4$),
S2 is side-product 2 (e.g., O, $O_2$, or CO),
S3 is side-product 3 (e.g., NO or $NO_2$), and
S4 is side-product 4.

The following equation in conjunction with equations (1) and (2) presents a general representation of the reaction involved in an etch-stop reaction:

$$ES + R \rightarrow EP + ES1 \qquad (3)$$

where
ES is etch-stop film (e.g., SiN if FM=$SiO_2$),
R is reactive clean gas (e.g., F, Cl, or Br),
EP is etch-stop product, and
ES1 is etch-stop side-product 1.

It has been found that progress of a plasma clean or etch process can be followed by tracking spectral emissions at certain wavelengths of the emitted light corresponding to excited states of at least two different reaction components.

In one embodiment, emissions of a product component (e.g., O, $N_2$, or CO) versus a reactant component (e.g., F) may be monitored. In one example, spectral emissions can be monitored by determining emission intensities, such as the sum of intensities over an emission band or the integral of the emission or mathematical manipulations thereof. Thus, in accordance with one embodiment of the present invention, a ratio of spectral emissions of selected reaction components may be monitored by OES to ascertain progress of the plasma clean or etch process and ultimately to determine the optimal endpoint for the clean or etch process. Advantageously, the present invention provides a real-time, in-situ endpoint detection method and system that avoids over-cleaning/etching and under-cleaning/etching.

Based upon equations (1) and (2), for plasma clean processes, the following groups may be used to form ratios in accordance with one embodiment of the present invention:

Group 1: I, A, P or SN (N=1,2,3, . . . )
Group 2: I, S1, A, or R

Components from Group 1 and Group 2 may be used to form ratio values, with components from a group being in either the numerator or denominator (i.e, numerator values and denominator values can be switched). However, the ratio cannot have the same component (e.g., I or A) as both the numerator and denominator as this would result in a value of one (1) at all times. Furthermore, any combination of the above components within one group (Group 1 or Group 2) can be used to form the numerator or denominator and does not need to be restricted to only one component. For example, the ratio signal can be a function of (I+P+S2+S3)/(I+R). In one embodiment, the ratio of the spectral emissions may be a reaction product component (e.g., I, P, SN) (N=1,2,3, . . . ) to a reaction reactant component (e.g., R).

Based upon equation (3) for etch-stop processes, etching of a substrate etch-stop film (ES) will form an etch-stop product (EP) and/or an etch-stop side-product (ES1). In this case, the following groups may be used to form ratios in accordance with one embodiment of the present invention:

Group 3: EP or ES1
Group 4: I, S1, A, or R

Similar to plasma clean processes, components from Group 3 and Group 4 may be used to form ratio values for etch-stop processes, with components from a group being in either the numerator or denominator (i.e, numerator values and denominator values can be switched). Furthermore, any combination of the above components within one group (Group 3 or Group 4) can be used to form the numerator or denominator and does not need to be restricted to only one component. In one embodiment, the ratio of the spectral emissions of at least two different reaction components may be a reaction product component (e.g., EP or ES1) to a reaction reactant component (e.g., R).

The following are examples of reactions involved in the clean of films comprising $SiO_2$, SiN, and SiC, respectively:

$$4F + SiO_2 \rightarrow SiF_4 + 2O \qquad (4)$$

$$8F + 2SiN \rightarrow 2SiF_4 + N_2 \qquad (5)$$

$$4F + O + SiC \rightarrow SiF_4 + CO \qquad (6)$$

For plasma cleans using $NF_3$ as a fluorine source, N or $N_2$ emissions can be used as a reference as N and $N_2$ are present at constant concentrations during the later part of the clean due to the high conversion factor of $NF_3$ to N and $N_2$ by the following reactions:

  (7)

  (8)

In this case, for the example of a SiC film clean using $NF_3$ as the F source, a ratio of a CO spectral emission to that of an N or $N_2$ emission may be utilized for optimal endpoint detection.

OES data unfortunately varies over time for any given process due to, for example, the transmission window becoming coated with polymers and other reaction products, power fluctuations in the chamber, variations in gas flow rates, and other causes. Measuring the intensity of just a single wavelength would likely result in false predictions or measurements because of this natural drift. In other words, if only one of these signals were used, modulations on the signal due to changing films deposited in the path of the optics or other system fluctuations would complicate repeatable endpoint detection.

The present invention eliminates this problem by using the ratio of at least two emissions from different chemical species that are in close wavelength proximity to one another. Utilizing a ratio of two emissions from different chemical species can offset many of the effects of changing transmission signals due to film depositions or changing plasma state because of the comparison to a reference signal. Close wavelengths are chosen in order to offset possible drift effects in signal transmission that can be caused by using different wavelengths. For example, choosing close wavelengths can cancel any difference in absorption of light by a film deposition at different wavelengths, offset any difference in interference patterns caused by a film deposition at different wavelengths, and offset any difference in fluctuation of intensity at different wavelengths. Close wavelength proximity between two reaction components chosen for the spectral emission ratio ranges from about 1 nm to about 50 nm, in accordance with one embodiment of the present invention.

The plasma clean or etch process is terminated when a ratio of the spectral emissions of at least two different reaction components (e.g., O/F, CO/N, $CO/N_2$), which is a function of the clean rate or remaining area of film to be cleaned, is within an overetch range, which is between a threshold value and an endpoint value cutoff. Once the threshold value is reached, an optional overetch step may occur until an endpoint value occurring at an endpoint time is reached. Furthermore, an initial delay in processing the ratio signal may be added to the beginning of the endpoint sequence to mask the transition to a reaction equilibrium in which an "early" endpoint may be detected.

Threshold values and overetch ranges are determined empirically. The threshold value is a reference point from which the amount of allowable overetch is determined. Preferably, the threshold value is close to the endpoint value cutoff but still in a range where good signal to noise allows accurate and repeatable determination of an endpoint time. The overetch range is determined by correlation to chamber performance; i.e., where particle performance is not affected by under-etching and thus, the overetch range is indicative of a "clean" plasma chamber. Accordingly, a threshold value for the ratio is empirically determined as a standard for a specific tool and process and an overetch range is empirically determined from calibration experiments correlated to particle performance.

The endpoint time in the overetch range may be determined by various methods. In one example, the clean step starts at a time 0 and the threshold value is reached at a time t. The overetch may be calculated based upon: 1) a percentage of time t being added to time t; 2) a fixed amount of time being added to time t; and 3) a combination of percentage of time t and fixed time.

Accordingly, in one example, endpoint time (EPT) is calculated at time t utilizing the following equation: EPT=(t-delay time)*1.25, where (t-delay time) is a fixed time factor and 1.25 is a percentage of time t factor. In another example, to vary the percentage of time t factor with clean time, EPT=(t-delay time)*1.25−[0.25*t*(t-delay time)/C]=(t-delay time)[1.25−Kt], where C and K are constants.

Alternatively, the derivative value of the spectral emission ratio, corresponding to rate of change of the ratio or rate of change of the clean rate, can be monitored to determine the endpoint of the plasma cleaning process. Similar to using a spectral emission ratio for determining endpoint, a threshold value for the derivative value is chosen empirically at a point before it reaches zero and in a range where good signal to noise allows accurate and repeatable determination of endpoint. Once a threshold value is reached, an optional overetch step may occur until an endpoint value occurring at an endpoint time is reached. The endpoint time in an overetch range may be determined by various methods as noted above. An endpoint cutoff value of zero, corresponding to a constant rate of change or zero rate of change, is used as the cutoff for the plasma process endpoint value.

Theoretically, the chamber is not completely clean until the ratio reaches zero (or a constant value if a spectral emission of a product gas is in the numerator of the ratio and the gas is being flowed into the chamber) or if the derivative value reaches zero. For example, if the emission ratio O/F is used, the O comes from equation (4) $4F+SiO_2 \rightarrow SiF_4+2O$. Thus, as the film is completely removed, O is absent and F is at a maximum value as F reactant goes unused. This results in the ratio O/F approaching zero, or if additional oxygen is fed into the reactor at a constant rate, O/F will approach a constant value and the derivative value or slope will approach zero. However, good particle performance can be achieved if the clean step(s) is (are) terminated at some point before the zero or constant values are reached. Thus, the overetch step, ranging between a threshold value and an endpoint value cutoff of either zero or a constant, is indicative of a "clean" plasma chamber.

By monitoring the ratio of spectral emissions or derivative value of the ratio (or function thereof), and by not permitting these indicators to exceed the endpoint value cutoff for the particular detector and emission line pair, the present invention optimally cleans a plasma chamber with more efficient use of plasma source gas and cleaning time and less chamber wall corrosion than is possible with current methods or systems.

Table I below shows different examples of species as well as different wavelengths of emission lines in close proximity which can be monitored to determine the progress and endpoint of a plasma clean or etch process, in accordance with one embodiment of the present invention.

TABLE I

| Film Being Cleaned or Etched | Ratios of Components at Wavelengths in Close Proximity |
|---|---|
| $SiO_2$ | O (777.5 ± 1 nm)/F (780 ± 2 nm) |
|  | O (777.5 ± 1 nm)/F (776 ± 2 nm) |
|  | O (616.5 ± 1 nm)/F (624.5 ± 2 nm) |
| SiN | $N_2$ (575–607 nm)/F (624.5 ± 2 nm) |
|  | $N_2$ (638–670 nm)/F (624.5 ± 2 nm) |
|  | $N_2$ (765–775 nm)/F (778 nm) |

TABLE I-continued

| Film Being Cleaned or Etched | Ratios of Components at Wavelengths in Close Proximity |
|---|---|
| SiC | CO (608 ± 3 nm)/F (624.5 ± 2 nm) |
|  | CO (643.5 ± 3 nm)/F (624.5 ± 2 nm) |
|  | CO (412 ± 3 nm)/$N_2$ (406 ± 3 nm) |
|  | ($NF_3$ used as F source) |
|  | CO (412 ± 3 nm)/$N_2$ (414.5 ± 3 nm) |
|  | ($NF_3$ used as F source) |

For cleaning films containing $SiO_2$, the following are examples of spectral emission ratios that may be used to detect the endpoint of a plasma clean process: O emissions at 777.5±1 nm divided by F emissions at 780±2 nm; O emissions at 777.5±1 nm divided by F emissions at 776±2 nm; and O emissions at 616.5±2 nm divided by F emissions at 624.5±2 nm. In one example, the O/F threshold value may be between about 0.01 and about 2, and the threshold value of the derivative of O/F may be between about 10 and about 50.

For cleaning films containing SiN, the following are examples of spectral emission ratios that may be used to detect the endpoint of a plasma clean process: $N_2$ emissions at 575–607 nm divided by F emissions at 624.5±2 nm; $N_2$ emissions at 638–670 nim divided by F emissions at 624.5±2 nm; and $N_2$ emissions at 765–775 nm divided by F emissions at 778 nm.

For cleaning films containing SiC, the following are examples of spectral emission ratios that may be used to detect the endpoint of a plasma clean process: CO emissions at 608±3 nm divided by F emissions at 624.5±2 nm; and CO emissions at 643.5±3 nm divided by F emissions at 624.5±2 nm. If $NF_3$ is used as a F source to clean films containing SiC, the following are examples of spectral line intensity ratios that may be used to detect the endpoint: CO emissions at 412±3 nm divided by $N_2$ emissions at 406±3 nm; and CO emissions at 412±3 nm divided by $N_2$ emissions at 414.5±3 nm.

Figure 2:
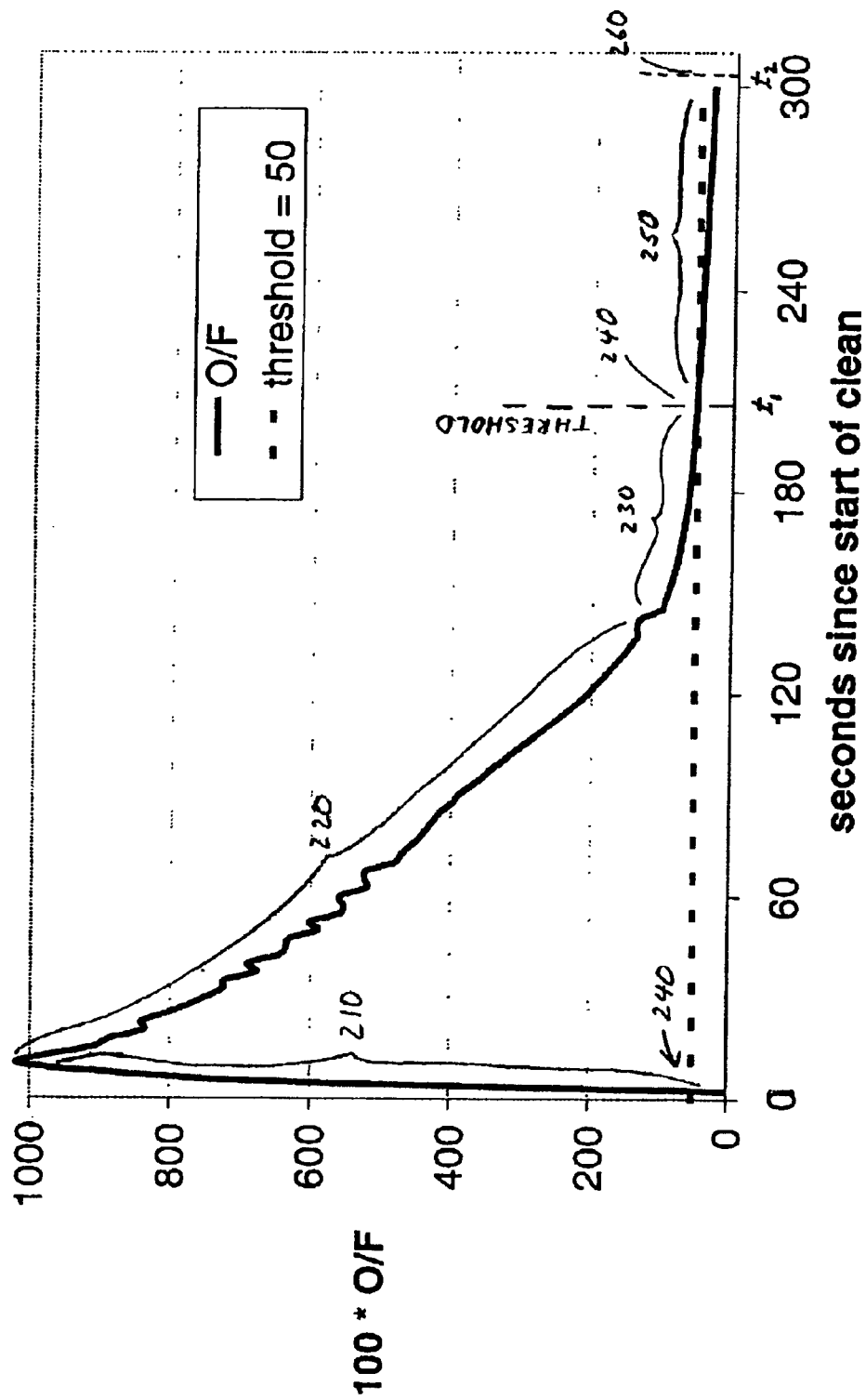
FIG. 2 shows a trace of a spectral emission ratio of O/F during a plasma cleaning process.

FIG. 2 shows one example of a spectral emission ratio trace of two reaction components, reaction product O and reaction reactant F, that may be used to determine the endpoint of a chamber cleaning process or plasma etch process involving $SiO_2$, in accordance with the present invention. The spectral emission ratio of O/F*100 is plotted along the Y-axis while the time (in seconds) is plotted along the X-axis. The spectral emission ratio, as shown in FIG. 2, is based upon the emission spectrum intensities of O and F at 777.5 nm and 780 nm, respectively. However, other wavelength pairs in close proximity could have been chosen as well, as shown in Table I.

As shown in FIG. 2, as the cleaning plasma is generated inside the reaction chamber, the spectral emission ratio is observed in stage 210 to sharply increase from a zero value to a certain peak level and then to decrease at a relatively constant rate through stage 220. A subsequent decrease in slope through stage 230 is then observed, signaling that the cleaning rate is decreasing and that a threshold value 240 occurring at a threshold time $t_1$ of the cleaning process is approaching. An initial delay is added in processing of the spectral emission ratio signal to mask the early reaction transition through the threshold value.

The threshold value is empirically determined when the signal-to-noise ratio is still good; i.e., when the signal is still recognizable over the noise. In one example, threshold value 240 has an O/F value between about 0.01 and about 2.

Once threshold value 240 is reached, an overetch is optionally performed through relatively flat area 250, which begins at threshold value 240 and ends at an endpoint value cutoff 260 occurring at an endpoint cutoff time $t_2$. The overetch may be determined based upon percentage or fixed time past the threshold value as previously discussed. Accordingly, the plasma chamber cleaning process can be terminated when the spectral emission ratio is within an overetch range 250 at an endpoint value occurring at a calculated endpoint time. In one example, the overetch range for an $SiO_2$ film is between about 0 seconds and about 200 seconds past time $t_1$. Cleaning beyond a zero value (or constant value if oxygen is being flowed into the chamber) indicates that plasma etching of the chamber wall will take place.

Figure 3:
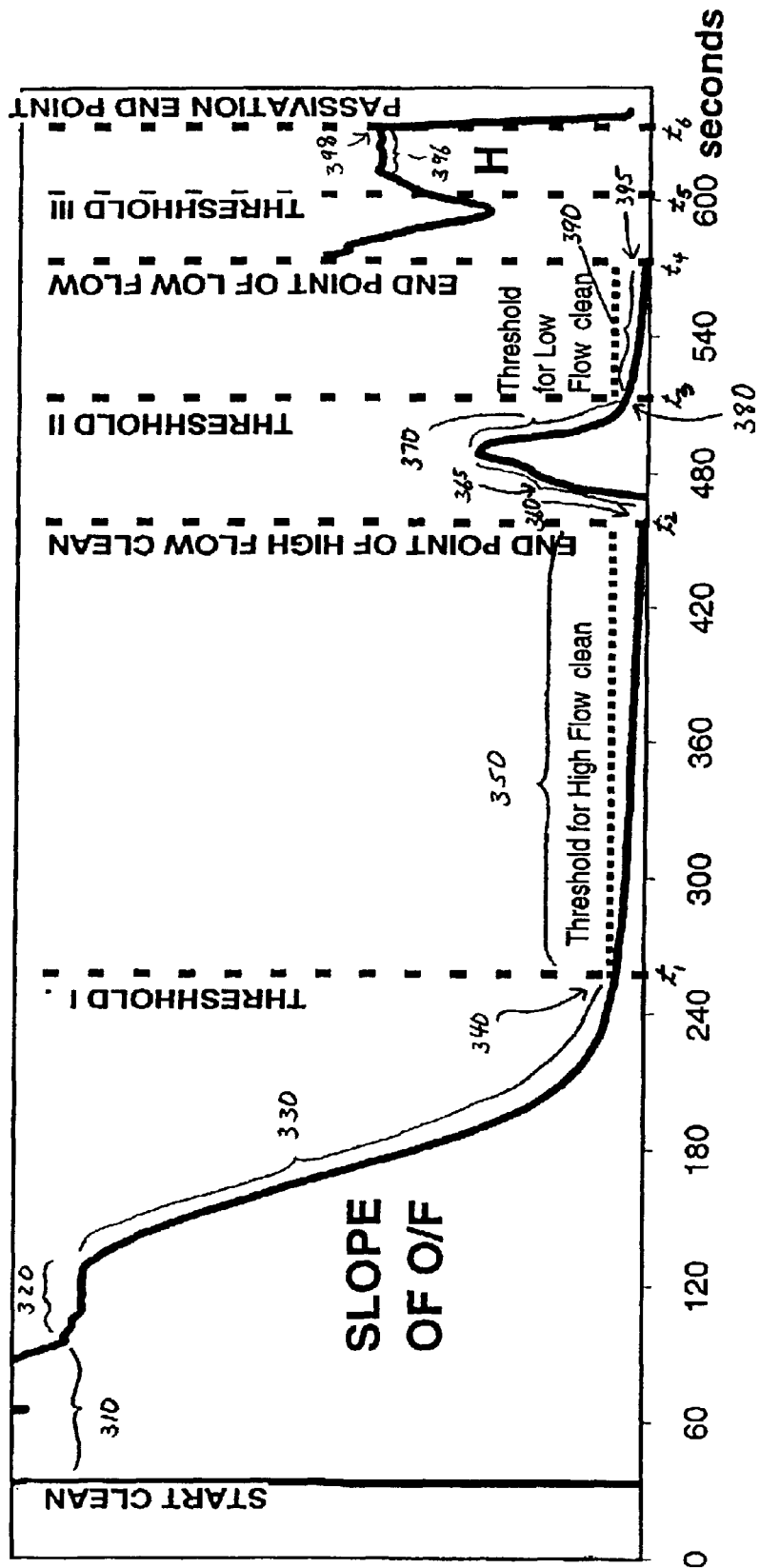
FIG. 3 shows a trace of the derivative of a spectral emission ratio of O/F during a plasma cleaning process.

Alternatively, FIG. 3 shows an example of a trace of the derivative value of the O/F spectral emission ratio as a function of time. The derivative value of the ratio corresponds to a change of rate of the ratio. The slope of the intensity ratio is defined generally as the negative change in the ratio over A seconds, multiplied by 10,000/A, where A is a multiple of 2.5. In one example, the slope of ratio O/F is defined as the negative change in O/F over 12.5 seconds, multiplied by 800. In FIG. 3, the slope of the spectral emission ratio of O/F is plotted along the Y-axis while the time (in seconds) is plotted along the X-axis. Emission spectrum intensities of O and F were sampled at 777.5 nm and 780 nm, respectively.

As shown in FIG. 3, three different levels of gas flow rates (high-flow, mid-flow, and/or low-flow) may be used for endpoint detection of the clean or etch process. For the case of a high flow clean, as the plasma is generated inside chamber 101, the slope of the spectral emission ratio is observed in stage 310 to sharply increase from a zero value to a certain peak level and then to sharply decrease to a level 320 after which it remains relatively constant over a period of time. This relatively flat area 320 corresponds to a time that the rate of change in cleaning rate is relatively constant. A subsequent drop 330 is then observed, signaling that the rate of change in cleaning rate is decreasing and that a threshold value 340 occurring at a threshold time $t_1$ of the cleaning process is approaching. As previously mentioned, an initial delay is added in processing of the spectral emission ratio signal to mask the early reaction transition through the threshold value.

The high-flow threshold value is empirically determined when the signal-to-noise ratio is still good; i.e., when the signal is still recognizable over the noise. Once threshold level 340 is reached, an endpoint time is calculated based upon time or percentage as previously discussed. The overetch may range through relatively flat area 350, which begins at threshold value 340 and ends at an endpoint value cutoff 360 occurring at an endpoint time $t_2$. Cleaning beyond endpoint value cutoff 360 indicates that plasma etching of the chamber wall will take place because a zero value for the ratio derivative is reached. Accordingly, the plasma chamber cleaning process can be terminated when the derivative value of the emission ratio is within an overetch range 350. In one example, the overetch range is between about 0 seconds and 50 seconds past time $t_1$.

Similarly, for the case of a low-flow clean, the spectral emission ratio slope is observed in stage 365 to increase from a zero value to a certain peak level after which a sharp drop 370 is observed. Drop 370 signals that the rate of change of the cleaning rate is decreasing and that a threshold level 380 of the cleaning process is approaching.

The low flow threshold value is again empirically determined when the signal is still recognizable over the noise. The chamber clean may be continued in an overetch step based upon time or percentage through relatively flat area 390, which begins at threshold time $t_3$ and ends at an endpoint value cutoff 395 occurring at an endpoint time $t_4$. Cleaning beyond endpoint value cutoff 395 indicates that plasma etching of the chamber wall will take place because a zero value for the ratio derivative is reached. Accordingly, the plasma chamber cleaning process can be terminated when the derivative value of the spectral emission ratio is within an overetch range.

Similarly, a method and system of the present invention may be utilized during a passivation step to determine endpoint, as further illustrated in FIG. 3. Examples of passivation reactions include the following:

  (9)

  (10)

H, O, or HF emissions and combinations of these components may be used to form emission ratios or derivative values of the emission ratios (or functions thereof). In one example, the spectral emission ratio may be a reaction product component (e.g., HF) to a reaction reactant component (e.g., H or O). As illustrated in FIG. 3, a threshold value occurring at time $t_5$ is empirically determined prior to a relatively flat region 396. The passivation rate is relatively constant through flat region 396 and a passivation endpoint 398 occurring at time $t_6$ may be set when an HF/H ratio derivative value sharply drops after flat region 396.

Table II below provides an example of parameters for a plasma chamber cleaning process in accordance with one embodiment of the present invention. In one example, with no intent to limit the invention thereby, the parameters are applicable for a plasma clean process of a 200 mm high density plasma (HDP) SPEED™ chamber at three different sets of flow rates. It is noted that similar levels of gas flow rates may apply when using either spectral emission ratios or derivative values of the spectral emission ratios for determining process endpoints. It is further noted that the plasma clean process with high-flow, mid-flow, and low-flow cleans and passivation step, in accordance with the present invention, can be carried out as multiple sequential steps where pressure and/or gas flow rates and/or reactive gases are changed for each step or as individual clean or etch steps with endpoint detection in accordance with the present invention being applied for each individual step.

TABLE II

| Parameter | High-Flow Clean | Mid-Flow Clean | Low-Flow Clean |
|---|---|---|---|
| $NF_3$ Flow rate (sccm) | 1,000 | 300–600 | 50–300 |
| $O_2$ Flow Rate (sccm) | 0–101 | 0–60 | 0–30 |
| He/Ar Flow Rate (sccm) | 0–10,000 | 0–6,000 | 0–3,000 |
| Plasma Power (kw) | 2.5–5.0 | 2.5–5.0 | 2.5–5.0 |
| Process Pressure (Torr) | 1–2 | 1–2 | 1–2 |

Figure 4:
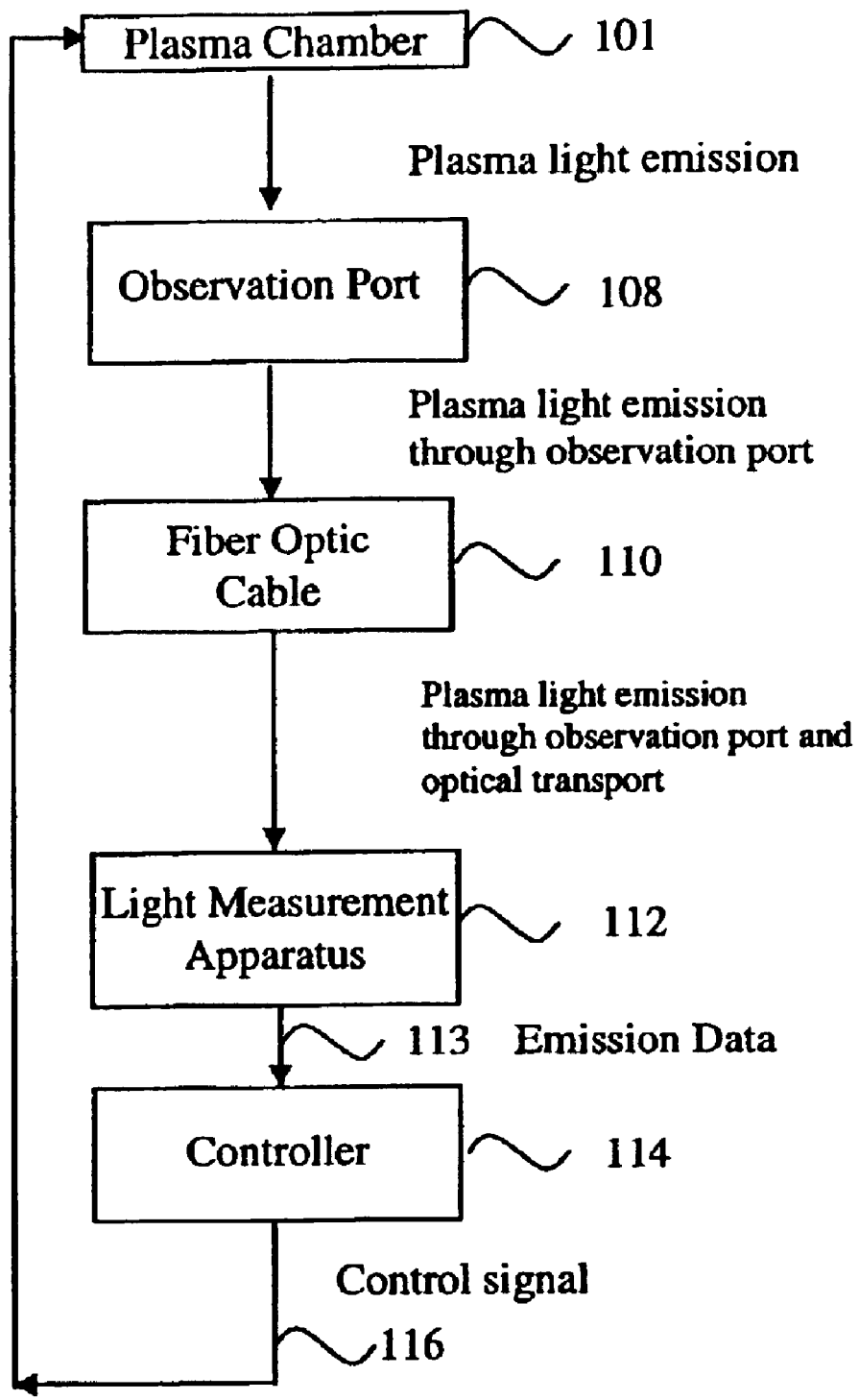
FIG. 4 is a flow chart of the signal processing path in accordance with one embodiment of the present invention.

Referring now to FIG. 4, a flow chart of the signal processing path in one embodiment of the present invention is shown. Plasma light emissions are produced in plasma chamber 101 during a plasma cleaning process. Plasma light emissions are transmitted through observation port 108 and to light measurement apparatus 112 through a transport 110, such as a fiber optic cable, in one example. Light measurement apparatus 112 then monitors light emission spectrum data and converts the data into a signal recognized by controller 114 and transmits the signal to controller 114 through interface 113. Controller 114 determines the state of the plasma cleaning process based on the converted data and parameters entered through a user interface and sends a control signal to plasma chamber 101 through interface 116 from which the plasma cleaning process may be terminated.

The above-described embodiments of the present invention are merely meant to be illustrative and not limiting. Various changes and modifications may be made. without departing from this invention in its broader aspects. Therefore, the appended claims encompass all such changes and modifications as fall within the true spirit and scope of this invention.

What is claimed is:

1. A method of monitoring a plasma process, comprising:
   providing a spectral emission of a first reaction component at a selected wavelength;
   providing a spectral emission of a second reaction component at a wavelength in close proximity to the selected wavelength of the first reaction component, wherein the close proximity is between about 1 nm and about 50 nm;
   determining a ratio consisting of an intensity of the first reaction component spectral emission and an intensity of the second reaction component spectral emission; and
   monitoring the ratio as a function of time to determine an endpoint of the plasma process.

2. The method of claim 1, wherein the first reaction component is selected from the group consisting of $SiF_x$, $OH_x$, $O_2$, O, $CO_x$, $COF_x$, $NO_x$, He, Ne, Ar, Kr, Xe, $N_2$, $NF_x$, $SO_x$, $SF_x$, $PF_x$, $OPF_x$, $BF_x$, $AsF_x$, and $BiF_x$, where x=0, 1, 2, 3, or 4.

3. The method of claim 1, wherein the second reaction component is selected from the group consisting of F, HF, Cl, Br, He, Ne, Ar, Kr, Xe, N, $N_2$, O, $O_2$, H, and $H_2$.

4. The method of claim 1, wherein the second reaction component is different from the first reaction component.

5. The method of claim 1, wherein the ratio consists of the intensity of the first reaction component spectral emission divided by the intensity of the second reaction component spectral emission.

6. The method of claim 1, wherein the ratio consists of the intensity of the second reaction component spectral emission divided by the intensity of the first reaction component spectral emission.

7. The method of claim 1, further comprising determining a second ratio consisting of intensities of spectral emissions of a plurality of reaction components divided by intensities of spectral emissions of a different plurality of reaction components.

8. The method of claim 1, wherein the ratio is selected from the group consisting of O (777.5±1 nm)/F (780±2 nm), O (777.5±1 nm)/F (776±2 nm), O (616.5±1 nm)/F (624.5±2 nm), $N_2$ (575–607 nm)/F (624.5±2 nm), $N_2$ (638–670 nm)/F (624.5±2 nm), $N_2$(765–775 nm)/F (778 nm), CO (608±3 nm)/F (624.5±2 nm), CO (643.5±3 nm)/F (624.5±2 nm), CO (412±3 nm)/$N_2$ (406±3 nm), and CO (412±3 nm)/$N_2$ (414.5±3 nm).

9. The method of claim 1, wherein the ratio consisting of an intensity of a reaction product component spectral emission as the intensity of the first reaction component spectral emission divided by an intensity of reaction reactant component spectral emission as the intensity of the second reaction component spectral emission.

10. The method of claim 9, wherein the reaction product component comprises O and the selected wavelength is between about 614 nm and about 779 nm.

11. The method of claim 9, wherein the reaction product component comprises $N_2$ and the selected wavelength is between about 575 nm and about 775 nm.

12. The method of claim 9, wherein the reaction product component comprises CO and the selckted wavelength is between about 605 nm and about 647 nm.

13. The method of claim 9, wherein the reaction reactant component is F at a wavelength between about 624 nm and about 782 nm.

14. The method of claim 9, wherein the reaction reactant component is $N_2$ at a wavelength between about 403 nm and about 418 nm.

15. The method of claim 1, further comprising determining a threshold value of the ratio, wherein the threshold value is reached at a threshold time.

16. The method of claim 15, further comprising calculating an endpoint time using the threshold time.

17. The method of claim 15, wherein the threshold value is between about 0.01 and about 2.0.

18. A method of monitoring a plasma process, comprising:

providing a spectral emission of a first reaction component at a selected wavelength;

providing a spectral emission of a second reaction component at a wavelength in close proximity to the selected wavelength of the first reaction component, wherein the close proximity is between about 1 nm and about 50 nm;

determining a ratio consisting of an intensity of the first reaction component spectral emission and an intensity of the second reaction component spectral emission;

determining a first derivative value of the ratio;

monitoring the first derivative value of the ratio as a function of time; and ending a plasma process before the first derivative value reaches a value of about zero.

19. The method of claim 18, wherein the first reaction component is selected from the group consisting of $SiF_x$, $OH_xO_2$, O, $CO_x$, $COF_x$, $NO_x$, He, Ne, Ar, Kr, Xe, $N_2$, $NF_x$, $SO_x$, $SF_x$, $PF_x$, $OPF_x$, $BF_x$, $AsF_x$, and $BiF_x$, where x=0, 1, 2, 3, or 4.

20. The method of claim 18, wherein the second reaction component is selected from the group consisting of F, HF, Cl, Br, He, Ne, Ar, Kr, Xe, N, $N_2$, O, $O_2$, H, and $H_2$.

21. The method of claim 18, wherein the second reaction component is different from the first reaction component.

22. The method of claim 18, wherein the ratio consists of the intensity of the first reaction component specral emission divided by the intensity of the second reaction component spectral emission.

23. The method of claim 18, wherein the ratio consists of the intensity of the second reaction component spectral emission divided by the intensity of the first reaction component spectral emission.

24. The method of claim 18, wherein the ratio is selected from the group consisting of O (777.5±1 nm)/F (780±2 nm), O (777.5±1 nm)/F (776±2 nm), O (616.5±1 nm)/F (624.5±2 nm), $N_2$ (575–607 nm)/F (624.5±2 nm), $N_2$ (638–670 nm)/F (624.5±2 nm), $N_2$ (765–775 nm)/F (778 nm), CO (608±3 nm)/F (624.5±2 nm), CO (643.5±3 nm)/F (624.5±2 nm), CO (412±3 nm)/$N_2$ (406±3 nm), and CO (412±3 nm)/$N_2$ (414.5±3 nm).

25. The method of claim 18, futher comprising selecting a threshold value of the derivative value, wherein the threshold value of the derivative value is reached at a threshold time.

26. The method of claim 25, further comprising calculating an endpoint time using the threshold time.

27. The method of claim 25, wherein the threshold value is between about 10 and about 50.

* * * * *